United States Patent
Miermans

(10) Patent No.: US 6,768,624 B2
(45) Date of Patent: Jul. 27, 2004

(54) FAN PROTECTION

(75) Inventor: Hubertus Cornelis Miermans, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 343 days.

(21) Appl. No.: 09/972,577

(22) Filed: Oct. 5, 2001

(65) Prior Publication Data

US 2002/0075615 A1 Jun. 20, 2002

(30) Foreign Application Priority Data

Dec. 18, 2000 (EP) ............................................ 00204632

(51) Int. Cl.[7] ................................................. H02H 5/00
(52) U.S. Cl. ........................... 361/106; 361/23; 361/24; 361/30; 361/103
(58) Field of Search ................................ 361/103, 106, 361/58, 115, 20–34, 78–102, 695

(56) References Cited

U.S. PATENT DOCUMENTS 5,991,153 A  * 11/1999  Heady et al. ................ 361/704
6,398,505 B1 *  6/2002  Sekiguchi ....................... 417/2

FOREIGN PATENT DOCUMENTS

| DE | 29702431 U | 2/1998 | ............ F04D/27/00 |
| JP | 06054440 A | 2/1994 | ............. H02H/7/08 |

OTHER PUBLICATIONS

Japanese Abstract—JP–A–61–15594 "Motor Protecting Device"—Jan. 23, 1986.
Japanese Abstract—JP–A–2–230411 "Detecting System For Fan Abnormality"—Sep. 12, 1990.

* cited by examiner

*Primary Examiner*—Stephen W. Jackson

(57) ABSTRACT

In a protection circuit for a plurality of fans, an element is associated with each fan. The impedance or the current value of the element indicates the operation condition of the fan. For example, the impedance or the current value may be low if the fan is operative or functioning normally, and high when the fan is inoperative or functioning abnormally. The elements are arranged in parallel between two conductive lines. A detection circuit determines the total impedance or current value between the two lines. If the total impedance or current is not within a predetermined range which indicates that all fans are operating normally, at least one of the fans functions abnormally. The number of lines required to convey the operation status of the fans to the detection circuit is only two and does not depend on the number of fans involved.

7 Claims, 2 Drawing Sheets

FAN PROTECTION

BACKGROUND OF THE INVENTION

1. Field of the Invention

The invention relates to a protection circuit for a plurality of fans, a cooling system comprising such a protection circuit, and a display apparatus comprising such a cooling system.

2. Description of the Related Art

Japanese Patent Application No. JP-A-61-15594 discloses fans which are each connected to an operating voltage via a series arrangement of a current sensor and a breaker. A comparison calculator compares, for each fan, the actual fan current as measured by the corresponding current sensor with a normal operating current. If the difference between the actual fan current and the normal operating current exceeds a prescribed allowable level, the corresponding breaker is opened. This fan protection device has the drawback that a conductive line is required from each current sensor to the comparison calculator to provide the actual fan currents.

SUMMARY OF THE INVENTION

It is an object of the invention to provide a protection circuit for a plurality of fans, wherein the number of conductive lines required to provide the actual operating status of the fans to a detection circuit does not depend on the number of fans.

To this end, a first aspect of the invention provides a protection circuit for a plurality of fans, the protection circuit comprising a plurality of elements, each element being associated with a corresponding one of the plurality of fans and having a property with a value depending on an operation condition of the corresponding one of said fans, the elements being arranged in parallel between a reference line and a protection line, and a detection circuit coupled to the protection line for detecting whether a total value of the parallel-arranged elements is in a range indicating that at least one of the fans is in an abnormal operation condition.

A second aspect of the invention provides a cooling system comprising a plurality of fans and a protection circuit as described above.

A third aspect of the invention provides a display apparatus having a plurality of fans and a protection circuit as described above.

In the protection circuit for a plurality of fans in accordance with the first aspect of the invention, a circuit (further referred to as the element or elements) indicating the operation condition of a corresponding fan, is associated with each fan. Each element has a property with a value which indicates whether the corresponding fan is operating normally or abnormally.

The elements are arranged in parallel between two conductive lines. The detection circuit determines the total value of the properties of parallel-arranged elements. If the total value is not within a predetermined range, which indicates that all the fans are operating normally, at least one of the fans functions abnormally. The number of lines required to convey the operation status of the fans to the detection circuit is only two and does not depend on the number of fans involved.

The protection circuit in accordance with the invention has the further advantage that the total value may indicate how many fans are not functioning properly. For example, if six fans are used, it may be decided to take action only if two or more fans are operating abnormally. In the prior art, all fans will be switched off when a single fan operates abnormally. The protection circuit may protect overheating of an apparatus if one or more fans are operating abnormally.

Japanese Patent Application No. JP-A-2-230411 discloses a system for detecting fan abnormality, wherein a fuse opens when the corresponding fan operates abnormally. All the fuses are arranged in series. One end of the series arrangement is connected to an input of a detector. A pull-up resistor is connected to the input of the detector. If one of the fans operates abnormally, the corresponding fuse opens the series chain of fuses and the input will be pulled to a high voltage by the pull-up resistor. This prior art does not disclose a parallel arrangement of the elements, and the detection circuit does not check the value of the properties of the parallel-arranged elements. Moreover, this prior art is unable to detect how many fans are functioning abnormally as it cannot be distinguished whether a single fan or more fans is or are operating abnormally.

In an embodiment of the subject invention, the element comprises a current source which supplies a current depending on the operation condition of the corresponding fan. The total current caused by the parallel-arranged current sources may be measured directly or converted into a voltage via a common impedance connected to the protection line. The measured current or voltage can be used to determine whether one or more fans is or are inoperative. For example, let it be assumed that the current sources do not supply current as long as the fans operate normally, and each current source produces a predetermined amount of current if a corresponding fan operates abnormally. The number of times that the predetermined amount of current appears in the total current indicates the number of fans that are inoperative.

In another embodiment of the invention, the current-determining element comprises an impedance element whose impedance value depends on the operation condition of the corresponding fan. The detection circuit determines the total impedance of the parallel-arranged impedance elements. If the total impedance is not within a predetermined range, which indicates that all the fans are operating normally, at least one of the fans functions abnormally.

In another embodiment of the invention, the impedance element comprises an impedance in series with a switch to decrease the tolerance of the measured impedance.

These and other aspects of the invention are apparent from and will be elucidated with reference to the embodiments described hereinafter.

DESCRIPTION OF THE PREFERRED EMBODIMENTS

Figure 1:
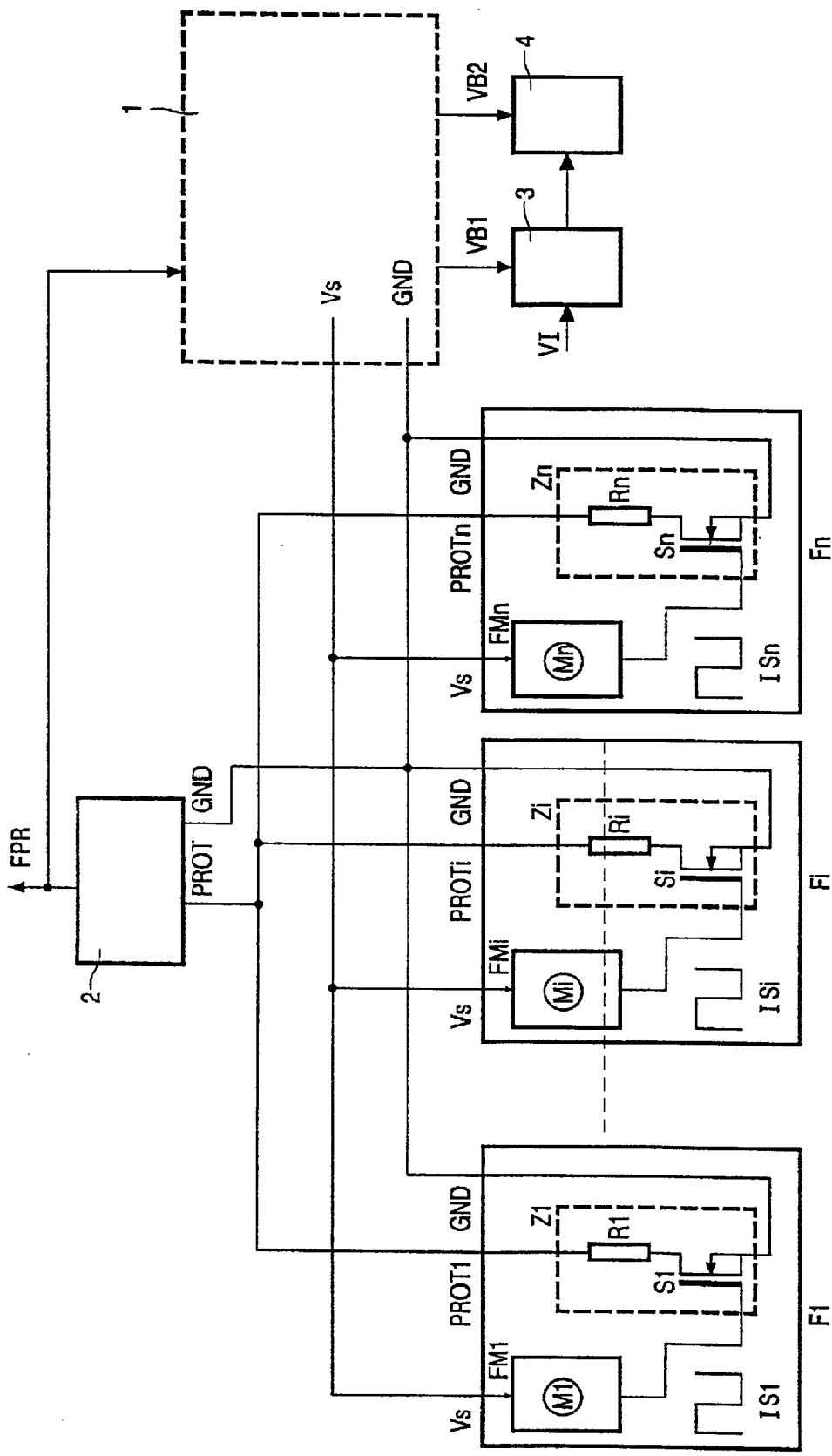
FIG. 1 shows a circuit diagram of an embodiment of the invention.
Figure 3:
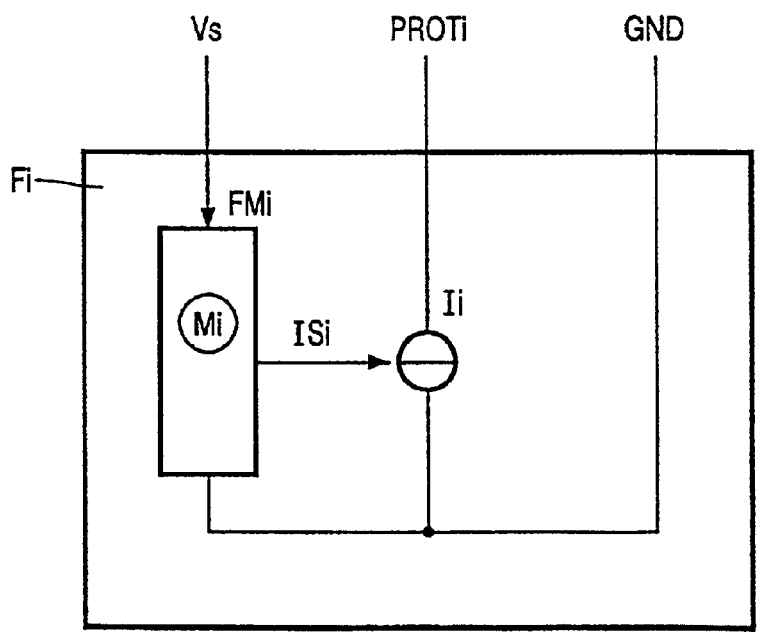
FIG. 3 shows a circuit diagram of an embodiment of a fan unit of the invention.

FIG. 1 shows a circuit diagram of an embodiment of the invention. Each fan unit F1 to Fn shown comprises a fan motor Mi and an electronic circuit FMi for producing a signal ISi indicating whether the fan motor Mi operates normally or abnormally. This signal ISi controls an impedance value of an impedance Zi, or, as shown in FIG. 3, the signal ISi controls a current of a current source Ii. A power supply 1 supplies a power supply voltage Vs via a common line to the N fan units F1 to Fn. The power supply current is returned via a common ground line GND. Each fan unit Fi comprises an impedance element Zi which has an impedance value dependent on the operation condition of the corresponding fan Fi. The impedance elements Zi (Z1 to Zn) are arranged between a common protection line PROT and the common ground line GND. A detector 2 is connected to the common protection line PROT and the common ground line GND to detect the total impedance of the parallel-arranged impedance elements Z1 to Zn. The detector 2 supplies a protection signal FPR which depends on the total impedance of the parallel-arranged impedance elements Z1 to Zn. This total impedance is indicative of the operation condition of the fans Fi.

For example, the impedance of an impedance element Zi associated with the fan Fi is within a first range when the fan Fi is operating normally, and the impedance is in a second range, which is disjunct with the first range, when the fan Fi is operating abnormally. In a preferred embodiment, as shown in FIG. 1, the impedance element Zi comprises a series arrangement of an impedance Ri (preferably a resistor) and a main current path of an electronic switch Si (preferably a FET). A control input of the electronic switch Si receives the signal ISi indicating the operation condition of the fan Fi as an input signal. In the example shown in FIG. 1, the control input receives a pulse signal ISi when the fan Fi is rotating. If the fan Fi stops rotating, the electronic switch Si becomes conductive or non-conductive continuously. The average impedance value of the impedance element Zi depends on the duty cycle of the pulse applied to the control input. Thus, the impedance value is lower when the fan Fi is inoperative and higher when the fan Fi is operative, or vice versa.

A lot of alternative embodiments are possible. The impedance element Zi may comprise a series arrangement of two impedances and a switch in parallel with one of the impedances. When the fan Fi operates normally, the impedance of the impedance element Zi is determined by the series arrangement of both impedances and when the fan Fi operates abnormally, the impedance of the impedance element Zi is determined by one of the impedances only, or the other way around.

The protection signal FPR may be supplied to the power supply 1 to switch off the power supply 1 if one, or more than a predetermined number, of fans Fi operates abnormally. If the fans Fi are used to cool a display apparatus which comprises processing circuitry 3 to process an input video signal VI to be displayed on a display device 4, the power supply voltages VB1 and VB2 supplied to the processing circuitry 3 and the display device 4, respectively, may be controlled to be disconnected (for example, the power supply is switched off, or the power supply voltage is interrupted) if one, or more than the predetermined number, of fans Fi operates abnormally. It is also possible to selectively switch off only circuits of the display apparatus which substantially contribute to the heating of the display apparatus. For example, the audio amplifiers may be switched off, or the amount of light produced by the display device may be decreased. The action to be taken to lower the dissipation in the interior part of the display apparatus may be dependent on the number of fans that are operating abnormally. This might be controlled by a microprocessor receiving a signal which is representative of the total impedance of the parallel-arranged impedances or the total current of the parallel-arranged current sources and switches off the relevant circuits, or limits the dissipation by limiting the audio output power and/or the light output of the display device. The signal received by the microprocessor might be obtained by an analog-to-digital (A/D) converter.

Figure 2:
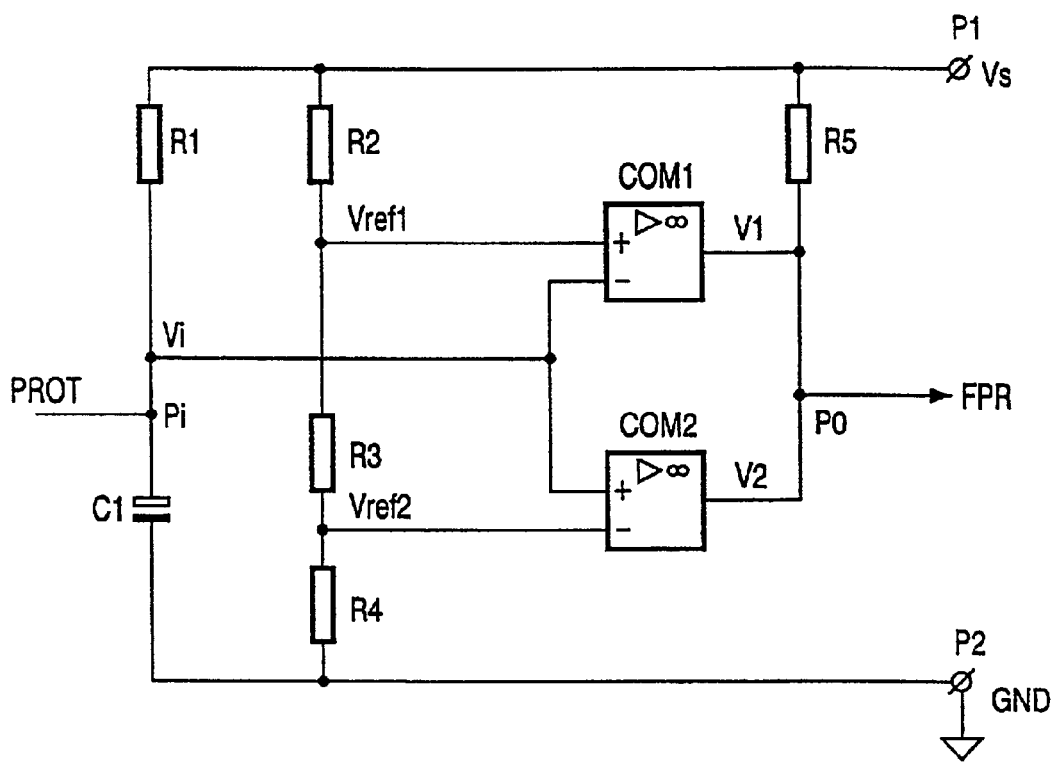
FIG. 2 shows an embodiment of a detection circuit in accordance with the invention.

FIG. 2 shows an embodiment of a detection circuit or detector 2 in accordance with the invention.

The detector 2 has an input terminal Pi connected to the common protection line PROT, an output terminal Po to supply the output signal FPR, a terminal P2 connected to ground, and a terminal P1 to receive a power supply voltage Vs.

A first comparator COM1 has a non-inverting input, an inverting input connected to the input terminal Pi, and an output connected to the output terminal Po. A second comparator COM2 has a non-inverting input, an inverting input connected to the input terminal Pi, and an output connected to the output terminal Po. A resistor R1 is connected between the input terminal Pi and the terminal P1. A capacitor C1 is connected between the input terminal Pi and the terminal P2. A resistor R2 is connected between the terminal P1 and the non-inverting input of the comparator COM1. A resistor R3 is connected between the non-inverting input of the comparator COM1 and the inverting input of the comparator COM2. A resistor R4 is connected between the inverting input of the comparator COM2 and the terminal P2. A resistor R5 is connected between the terminal P1 and the output terminal Po.

The operation of the detector 2 will now be described. The input voltage Vi at the input terminal Pi of the detector 2 is smoothed by the capacitor C1 and may be determined by the total impedance of the parallel-arranged impedance elements Zi or by the parallel-arranged current sources Ii. If the input voltage Vi is lower than the reference voltage Vref2 at the inverting input of the second comparator COM2, the second comparator forces the output signal FPR to a low level. If the input voltage Vi is higher than the reference voltage Vref1 at the non-inverting input of the comparator COM1, the output signal FPR is forced to the low level by the output of this comparator COM1. If the input voltage Vi is in a range between the reference voltage Vref1 and the reference voltage Vref2, neither of the comparators COM1 and COM2 will force the output signal FPR low, and, consequently, the resistor R5 causes the output signal FPR to be at a high level (the outputs of the comparators COM1 and COM2 are open collectors).

Thus, when the total impedance value of the parallel-arranged impedance elements Zi, or the total current of the parallel-arranged current sources Ii is in a range in which the input voltage Vi is in between the reference voltages Vref1 and Vref2, this is indicative that the fans are operating normally, which is indicated by a high level of the output signal FPR. If one or more of the fans operates abnormally, this total impedance will have such a value that the input voltage Vi is not within this range between the reference voltages Vref1 and Vref2, and the output signal FPR has a low level. It is possible to select the reference levels in such a way that more than a predetermined number of fans is detected to be operating abnormally.

It is also possible to determine the total impedance value of the parallel-arranged impedance elements Z1 to Zn by measuring a voltage across the total impedance in response to an applied predetermined current.

FIG. 3 shows a circuit diagram of an embodiment of a fan unit Fi of the invention. The fan unit Fi shown comprises a fan motor Mi and an electronic circuit Fmi for retrieving a signal ISi indicating whether the fan motor Mi operates normally or abnormally. This signal ISi controls a current source Ii to supply different predetermined currents dependent on the operation condition of the fan motor Mi. The fan unit Fi shown in FIG. 3 may replace the fan units F1 to Fn shown in FIG. 1. The detection circuit 2 of FIG. 2 may measure the total current generated by the parallel-arranged current sources of the fan units F1 to Fn as a voltage across the resistor R1. However, the total current may be measured in any other suitable way.

It should be noted that the above-mentioned embodiments illustrate rather than limit the invention, and that those skilled in the art will be able to design many alternative embodiments without departing from the scope of the appended claims. In the claims, any reference signs placed between parenthesis shall not be construed as limiting the claim. Use of the verb "to comprise" and its conjugations does not exclude the presence of elements or steps other than those stated in a claim. The invention can be implemented by means of hardware comprising several distinct elements, and by means of a suitably programmed computer. In the device claim enumerating several means, several of these means can be embodied by one and the same item of hardware.

What is claimed is:

1. A protection circuit for an apparatus comprising:
   a single supply voltage bus for supplying a voltage;
   a single ground bus for supplying a return for current from the supply bus;
   a single protection line bus;
   a plurality of fans units, each fan unit comprising a fan and an element, said element having a property with a value depending on an operation condition of the fan, wherein the fan is arranged between the single supply voltage bus and the single ground bus, and the element is arranged between the single protection line bus and the single ground bus; and
   a detection circuit coupled between the single protection line bus and the single ground bus for detecting a total value of the plurality of elements of the plurality of fan units arranged in parallel to the single protection line bus and the single ground bus, said detection circuit comprising comparing means for determining whether said total value of the plurality of elements is in a range indicating that at least one of the fans is in an abnormal operation condition.

2. The protection circuit as claimed in claim 1, characterized in that each of the plurality of elements comprises a current source for supplying a current having a value dependent on the operation condition of the corresponding fan.

3. The protection circuit as claimed in claim 1, characterized in that each of the plurality of elements comprises an impedance element having a value dependent on the operation condition of the corresponding fan.

4. The protection circuit as claimed in claim 3, characterized in that each of the impedance elements comprises a series arrangement of a resistor and a main current path of an electronic switch, a control input of the electronic switch being coupled to the corresponding fan for receiving a signal indicating whether the fan is operative or inoperative.

5. A cooling system, having a protection circuit, for an apparatus, the protection circuit comprising:
   a single supply voltage bus for supplying a voltage;
   a single ground bus for supplying a return for current from the supply bus;
   a single protection line bus;
   a plurality of fan units, each fan unit comprising a fan and an element, said element having a property with a value depending on an operation condition of the fan, wherein the fan is arranged between the single supply voltage bus and the single ground bus, and the element is arranged between the single protection line bus and the single ground bus; and
   a detection circuit coupled between the single protection line bus and the single ground bus for detecting a total value of the plurality of elements of the plurality of fan units arranged in parallel to the single protection line bus and the single ground bus, said detection circuit comprising comparing means for determining whether said total value of the plurality of elements is in a range indicating that at least one of the fans is in an abnormal operation condition to protect overheating of the apparatus.

6. A display apparatus comprising a display device and a cooling system having a protection circuit for cooling the display apparatus, characterized in that the protection circuit comprises:
   a single supply voltage bus for supplying a voltage;
   a single around bus for supplying a return for current from the supply bus;
   a single protection line bus;
   a plurality of fan units, each fan unit comprising a fan and an element, said element having a property with a value depending on an operation condition of the fan, wherein the fan is arranged between the single supply voltage bus and the single ground bus, and the element is arranged between the single protection line bus and the single ground bus; and
   a detection circuit coupled between the single protection line bus and the single ground bus for detecting a total value of the plurality of elements of the plurality of fan units arranged in parallel to the single protection line bus and the single ground bus, said detection circuit comprising comparing means for determining whether said total value of the plurality of elements is in a range indicating that at least one of the fans is in an abnormal operation condition, to protect overheating of the display apparatus.

7. The display apparatus as claimed in claim 6, characterized in that the detection circuit comprises means for selectively limiting the power dissipation in the display apparatus in dependence on a number of fans operating abnormally.

* * * * *